United States Patent [19]
Linder

[11] 3,786,542
[45] Jan. 22, 1974

[54] METHOD OF FORMING CIRCUIT STRUCTURES BY PHOTO ETCHING-ELECTROFORMING PROCESS

[75] Inventor: Jacques Francois Linder, Palos Verdes Peninsula, Calif.

[73] Assignee: Northrop Corporation, Los Angeles, Calif.

[22] Filed: Nov. 18, 1971

[21] Appl. No.: 200,016

[52] U.S. Cl. .................................. 29/25.17, 156/11
[51] Int. Cl. .............................................. H01j 9/00
[58] Field of Search ....... 29/25.17, 25.18, 625, 626; 156/11

[56] References Cited

UNITED STATES PATENTS

| | | | |
|---|---|---|---|
| 2,670,523 | 3/1954 | Orthuber et al. | 29/25.17 |
| 2,540,635 | 2/1951 | Steier | 29/25.17 |
| 3,321,657 | 5/1967 | Granitsas et al. | 29/25.17 |
| 3,681,134 | 8/1972 | Nathanson et al. | 156/11 |
| 3,366,519 | 1/1968 | Pritchard, Jr. et al. | 156/3 |
| 3,447,960 | 6/1969 | Tonozzi | 156/11 |
| 3,657,029 | 4/1972 | Fuller | 156/11 |

*Primary Examiner*—Lowell A. Larson
*Attorney, Agent, or Firm*—Sokolski, McCormack & Schaap

[57] ABSTRACT

A mandrel or mold shaped in a desired configuration is formed by photoprocessing a film of photopolymer applied to a substrate. A metallic structure is formed in the mold by electroforming. The photopolymer forming the mold is then dissolved away leaving the desired metallic configuration.

2 Claims, 8 Drawing Figures

METHOD OF FORMING CIRCUIT STRUCTURES BY PHOTO ETCHING-ELECTROFORMING PROCESS

This invention relates to the use of photopolymerization techniques in forming circuit structures, and more particularly to such a technique in which a mold is formed of a photopolymer, this mold being used for making circuit structures.

Photoresists of photopolymeric material are used extensively both for the fabrication of printed circuit boards and in chemical machining. Recently, solid films of photopolymer have been developed which can be used to provide resist layers of uniform thickness (0.5–20 mils) and considerably thicker than that obtainable with liquid photoresists. Among these dry film photoresists are Riston, a product of DuPont de Nemours & Co., and Laminar, a product of Dynachem Corporation, Santa Fe Springs, Calif. The fabrication of dry film photoresists is described in U.S. Pat. No. 3,469,982 issued Sept. 30, 1969.

This invention pertains to a unique method involving the use of relatively thick layered photoresist material, such as the aforementioned photopolymer films, for forming circuit structures in which a mold in the desired configuration is formed from the film and this mold then used for forming the desired end structure. Thus, the photoresist material is not used as a mask in the etching process, but rather is used to form a physical mold by means of which the desired structure is fabricated. Utilizing fairly thick photoresist material, such as film photopolymers now available which can be laminated to a thickness of 10–20 mils, it is possible to form members having good structural characteristics for application requirements demanding such structural features.

Furthermore, due to the repetitive application of the basic technique of the invention, multiple layers can be formed of different thicknesses and different metals. Thus, the technique of the invention can be used effectively, as to be pointed out in the specification, to form miniature filaments on a heavy bus bar pattern, multilayered fluidics circuits and the like where a complex structure with mechanical integrity is required.

It is therefore an object of this invention to enable the construction of miniature circuit elements having more complex and improved structural characteristics.

It is another object of this invention to enable the utilization of photoresist material as a mold in forming miniature structural elements.

It is still another object of this invention to facilitate the fabrication of multi-layer miniature circuit elements in situations where structural integrity is required.

Other objects of this invention will become apparent as the description proceeds in connection with the accompanying drawings, of which:

Briefly described, the technique of the invention is practiced as follows:

A thin metallic layer is first deposited onto a flat, smooth, insulating substrate, e.g., glass. The nature and thickness of this layer can be varied depending on whether the final structure is to adhere to the substrate or to be removed from it. This layer will either be continuous or have a pattern formed thereon as, for example, by photoetching. A relatively thick layer of a photo-resist such as photopolymeric material, which may be in the form of a dry film, is placed over this metallic layer. A pattern is then formed in the polymeric film which pattern corresponds or is related to that of the thin metallic layer if there is any pattern, the pattern in the polymeric film being formed by photopolymerization techniques. A mold is thus formed in the polymeric film, this mold having a metallic base layer. The mold is then filled with metallic material by electro-forming over the base layer. This process may be repeated several times over the initial layer to achieve a desired configuration. When the desired metallic structure has been formed, the photopolymeric material forming the mold is dissolved or sublimated, leaving the desired metallic structure.

Let us now look at two examples of the use of the technique of the invention in forming circuit structures. It is to be noted that these are just two exemplary applications of the inventive technique and that it can be used to equal advantage in numerous other applications.

EXAMPLE I

This application of the technique of the invention involves the fabrication of an area cathode with thermionic filaments which is suitable for use as the electron source in an electron beam scanner, such as described in U.S. Pat. No. 3,408,532, issued Oct. 29, 1968, and assigned to Northrop Corporation, the assignee of the present application. The technique of this invention greatly facilitates the fabrication of such an area cathode enabling mass production of this element to precise specifications, and with relatively rugged structural characteristics so as to enable functioning under severe shock and vibration conditions which might be encountered in the field.

Referring now to FIGS. 1–5, the steps in the fabrication of the area cathode are sequentially illustrated.

Figure 1:
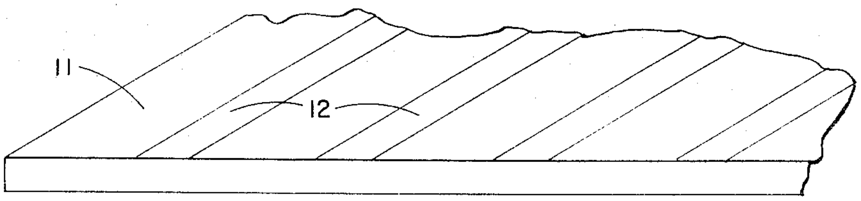
FIGS. 1–5 are a series of perspective drawings illustrating the use of the technique of the invention in forming a flat array of cathodes.

First, as shown in FIG. 1, thin metallic stripes 12 are formed on a substrate 11 which may be of glass or quartz. The stripes 12 may be of chromium/gold applied by first evaporating a thin layer of such material on the surface of substrate 11 and then by selectively etching, using a photoresist masking with etching techniques well known in the art.

Figure 2:
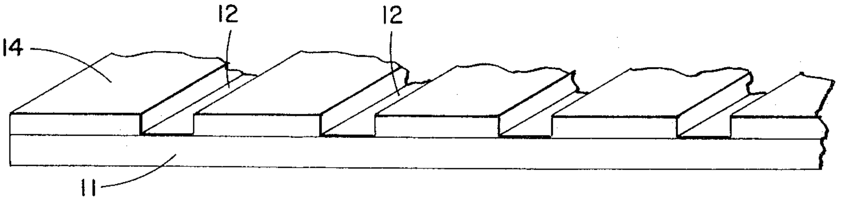

Next, as illustrated in FIG. 2, film of dry photopolymeric material 14 is laminated onto the surface of substrate 11 and over metallic stripes 12. The photopolymeric film may be of Riston, available commercially from the DuPont Company, and which is described in U.S. Pat. No. 3,469,982, or may be Laminar, available from Dynachem Corporation, Santa Fe Springs, Calif. The film used should have about a 10 mil thickness, three layers of Riston 30 being a particular polymeric film satisfying these requirements. The film 14, which initially covers the entire surface including the stripes 12, is then exposed to light through the transparent substrate 11 or through a suitable mask and with developing, the unexposed photopolymer portions opposite stripes 12 are washed away, leaving us with the structure shown in FIG. 2.

Figure 3:
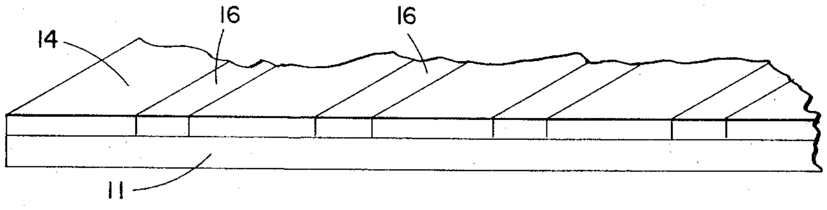

Referring now to FIG. 3, a metallic material, such as copper, is now electroformed over the metallic stripes 12 to fill up the grooves, thereby forming bars 16 therein. Grinding might be required to bring the top surface of bars 16 flush with the surfaces of the polymeric material 14.

Figure 4:
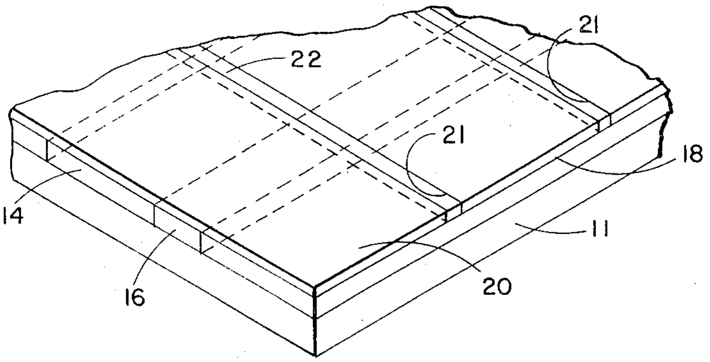

Referring now to FIG. 4, we now apply over the bars 16 and the photopolymer 14 a thin layer 18 of metal which may be nickel of the order of 500–1000 Angstroms thick, by a technique such as vacuum evaporation, electroless plating, etc. Over this thin metallic layer, a photopolymeric photoresist 20 is placed which may comprise a dry photopolymeric film such as Riston, this film being much thinner than that used for layer 14. Thus, a layer 20 is formed, this layer being exposed through a photo mask and developed to form a plurality of spaced grooves 21 extending from one edge of the element to the other, and running transversely to bars 16. A metal such as nickel is then plated onto the parts of thin metal layer 18 lying in the grooves to fill the grooves to form metallic rods 22. Typically rods 22 may be of the order of 0.0003 –0.001 inch in width and 0.0001 – 0.0005 inch thick.

Figure 5:
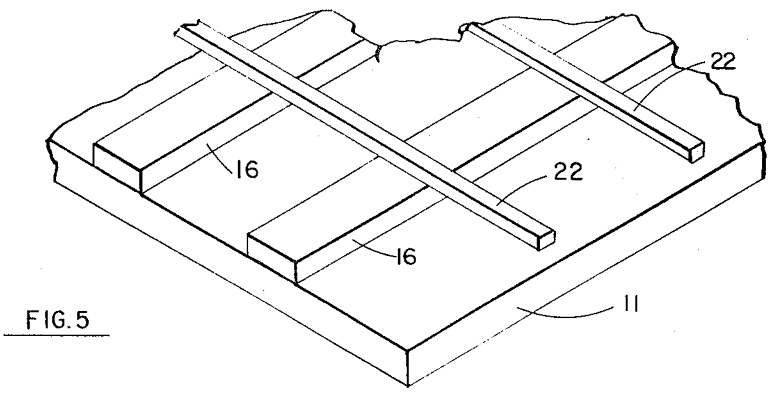

Referring now to FIG. 5, the photopolymeric photoresist material is now dissolved leaving nickel rods 22 suspended between copper bars 16, the copper bars in turn being supported on glass substrate 11. The thin metallic film between the bars is too thin to sustain itself and disappears. Rods 22 then may be coated with a suitable electron emissive oxide so they are ready to be used as thermionic filaments with voltage being applied between bars 16.

EXAMPLE II

Figure 6:
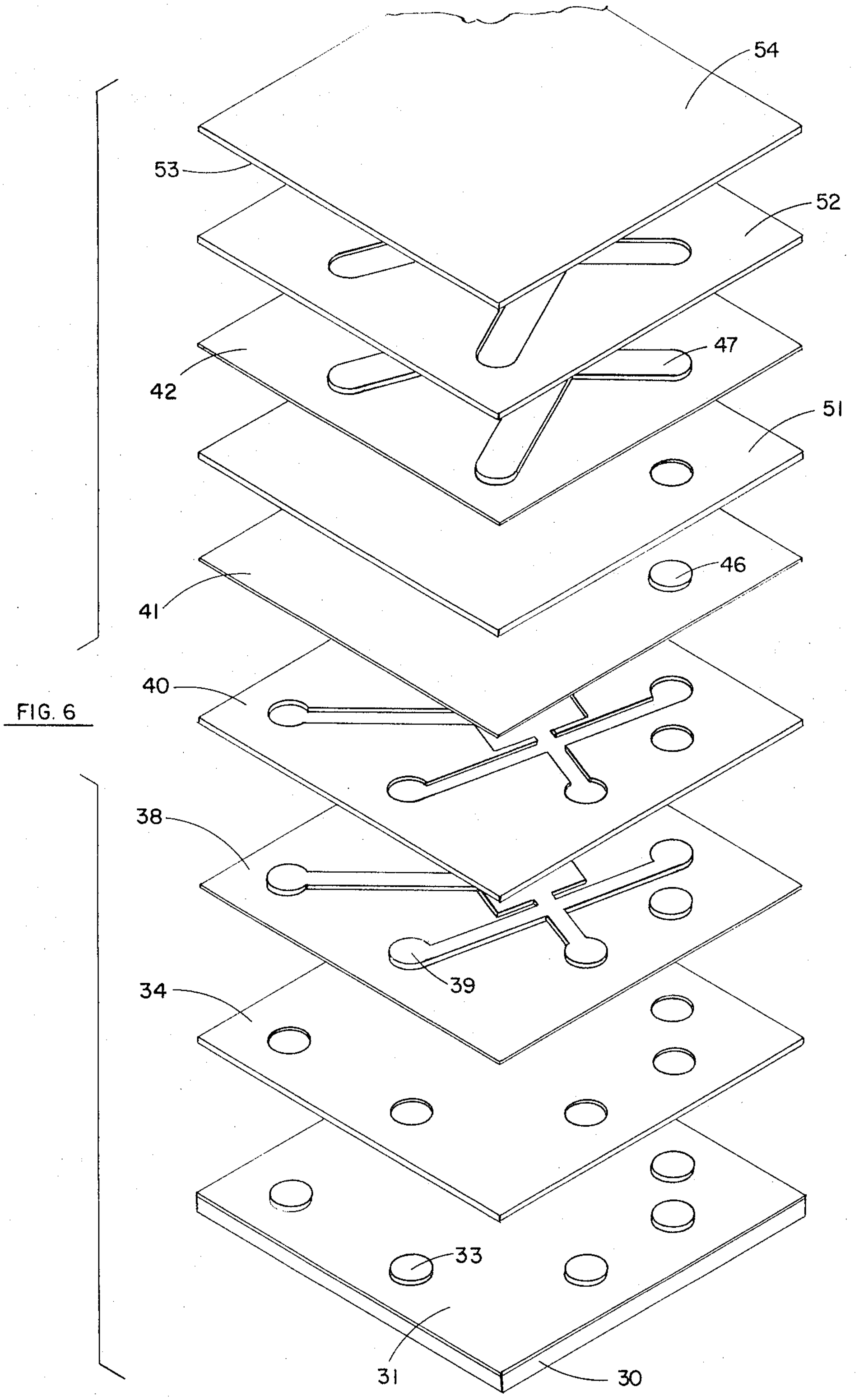
FIG. 6 is a perspective exploded view illustrating the use of the technique of the invention in forming a fluidic circuit.
Figure 7:
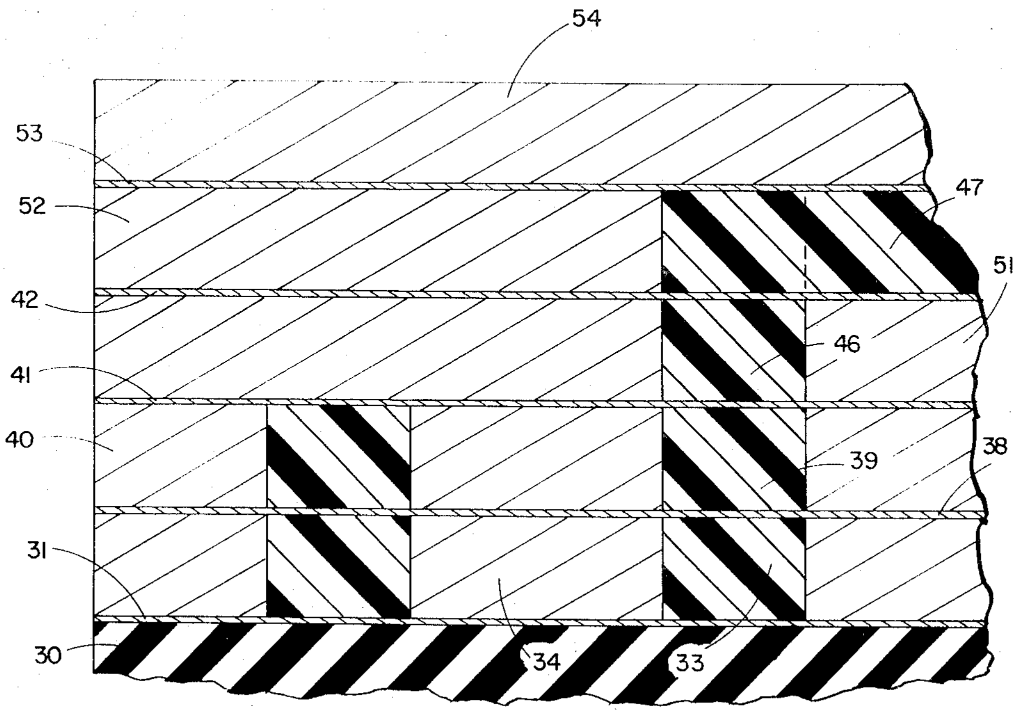
FIG. 7 is a cross sectional view illustrating the use of the technique of the invention in forming a fluidic circuit.
Figure 8:
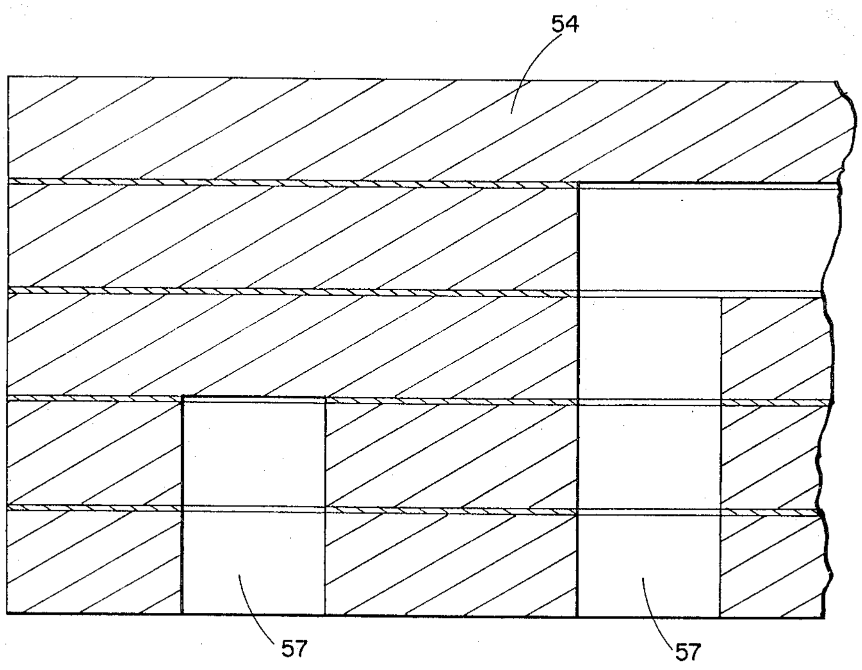
FIG. 8 is a cross sectional view illustrating a fluidic circuit fabricated by the technique of this invention.

This example involves the fabrication of a fluidic circuit for handling fluidic signals. Referring to FIG. 6, the fabrication of the board is shown in an exploded view. First, metallic coating 31 is deposited on substrate 30, which may be of ceramic or glass, by suitable electrodeposition techniques. Next a film of dry photopolymeric material which may be of the order of 10 mils in thickness, such as three layers of Riston 30, is placed over metallic coating 31. The photopolymeric material is then photo exposed in a predetermined pattern and developed to form pillars 33 thereof which extend upwardly from surface 31, the remainder of the photopolymeric material being washed away. Next, metallic material is electroformed on the thin metal layer 31 to form a metallic layer 34 which completely surrounds pillars 33 and which is of the same thickness thereas. Next, a thin metallic layer 38 is formed over the surface of layer 34 with a photopolymeric mold 39 in the indicated pattern being formed on this surface in the same manner as described for the first layer. Again in the same manner as just described, a metallic layer 40 is formed on layer 38 around mold 39. This same process is repeated by means of metallic layers 41 and 42, polymeric mold portions 46 and 47 and electroformed layers 51 and 52 to form the structural configuration shown in FIG. 7. A thin metallic layer 53 followed by a continuous thick electroformed layer 54 covers and closes the top of the assembly. The entire structure thus formed can be then detached from the base substrate and placed in a stripping bath which will penetrate through the openings and dissolve away the photopolymer, leaving a cavity structure 57 suitable for use as a fluidic circuit. If the metallic structure can be heated to 300° C to 400°C, and maintained at this temperature for an hour or so, the photopolymer will sublimate or decompose and burn, obviating the need for the stripping bath. Thus, just as for the first Example, the dry photopolymeric film is used as a mold or mandrel, around which the metallic structure can be formed by electroforming techniques.

It should be readily apparent that the same basic technique can be utilized to form a multitude of different structures. As initially indicated, this technique is particularly useful where structural integrity is a factor, such that relatively thick structural elements need be formed. While the technique of this invention has been described and illustrated in detail in connection with examples thereof, it is to be clearly understood that this is intended by way of illustration and example only and is not to be taken by way of limitation, the spirit and scope of this invention being limited only by the terms of the following claims. I claim 1. A method for forming a circuit structure comprising the steps of:

a. depositing a relatively thin metallic layer on a nonmetallic substrate in a predetermined pattern;
b. placing a relatively thick layer of photopolymeric film over said metallic layer;
c. photo exposing and developing said photopolymeric film to form a mold in a predetermined pattern;
d. depositing metallic material on the portions of said metallic layer in said mold to a level sufficient to fill said mold;
e. repeating the steps set forth in steps *a–d* to deposit metallic material in a second predetermined pattern in a mold formed over the first mold, the metallic layer of step *a* being deposited over the metallic material and photopolymeric film; and
f. removing the photopolymeric film to leave the structure formed by the metallic material and the substrate.

2. A method for forming a miniature cathode structure comprising the steps of:

a. depositing thin metallic strips on an insulating substrate in a bar pattern;
b. placing a relatively thick layer of photopolymeric film over said strips;
c. photodeveloping said film in the bar pattern formed by said strips to form a mold surrounding said strips;
d. depositing metallic material over said strips to a level sufficient to fill said mold to form bars;
e. depositing a thin metallic layer over said metallic material and said mold material;
f. placing a photopolymeric film over said last mentioned thin metallic layer;
g. photoexposing said last mentioned polymeric film in a second bar pattern running transverse to the first mentioned bar pattern;
h. photodeveloping the last mentioned film to form a mold having grooves corresponding to said second bar pattern;

i. depositing metallic material on said thin metallic layer to fill said mold to form rods extending between said bars;

j. dissolving away all of said photopolymeric films; and k. coating said rods with an electron emissive material.

* * * * *